United States Patent
Gu et al.

(10) Patent No.: US 8,682,384 B2
(45) Date of Patent: Mar. 25, 2014

(54) MOBILE TERMINAL, AND VOLUME ADJUSTING METHOD AND DEVICE THEREOF

(75) Inventors: Jianliang Gu, Huizhou (CN); Zhan Gu, Huizhou (CN)

(73) Assignee: Huizhou TCL Mobile Communication Co., Ltd., Huizhou, Guangdong Province (CN)

( * ) Notice: Subject to any disclaimer, the term of this patent is extended or adjusted under 35 U.S.C. 154(b) by 0 days.

(21) Appl. No.: 13/514,600

(22) PCT Filed: Mar. 29, 2011

(86) PCT No.: PCT/CN2011/072238
§ 371 (c)(1),
(2), (4) Date: Jun. 7, 2012

(87) PCT Pub. No.: WO2012/009985
PCT Pub. Date: Jan. 26, 2012

(65) Prior Publication Data
US 2012/0264481 A1      Oct. 18, 2012

(30) Foreign Application Priority Data
Jul. 21, 2010    (CN) .......................... 2010 1 0233164

(51) Int. Cl.
*H04W 88/02*    (2009.01)
(52) U.S. Cl.
USPC .......................... 455/550.1; 455/567; 455/570

(58) Field of Classification Search
USPC ........ 455/550.1, 566, 567, 570, 575.1, 226.1, 455/347, 351
See application file for complete search history.

(56) References Cited

U.S. PATENT DOCUMENTS

| | | | |
|---|---|---|---|
| 7,835,773 B2 * | 11/2010 | Angelopoulos | 455/570 |
| 2005/0282590 A1 * | 12/2005 | Haparnas | 455/570 |
| 2008/0102902 A1 * | 5/2008 | Epley | 455/567 |
| 2008/0153537 A1 * | 6/2008 | Khawand et al. | 455/550.1 |

FOREIGN PATENT DOCUMENTS

| | | |
|---|---|---|
| CN | 1390383 A | 1/2003 |
| CN | 101136956 A | 3/2008 |
| CN | 101753111 A | 6/2010 |
| CN | 101924828 A | 12/2010 |

* cited by examiner

*Primary Examiner* — Thanh Le
(74) *Attorney, Agent, or Firm* — Cheng-Ju Chiang

(57) ABSTRACT

The present disclosure relates to the technical field of mobile terminals, and discloses a mobile terminal and a volume adjusting method and device thereof. The volume adjusting method comprises the following steps of: acquiring a noise pressure signal from surroundings of the mobile terminal; comparing a volume value corresponding to the acquired noise pressure signal with a volume control value currently set in the mobile terminal; adjusting the volume control value of the mobile terminal according to the comparison result; and controlling a volume level of the mobile terminal according to the volume control value that has been adjusted.

14 Claims, 2 Drawing Sheets

MOBILE TERMINAL, AND VOLUME ADJUSTING METHOD AND DEVICE THEREOF

CROSS REFERENCE TO RELATED APPLICATIONS

The present application is a 35 U.S.C. §371 National Phase conversion of International (PCT) Patent Application No. PCT/CN2011/072238, filed on Mar. 29, 2011, the disclosure of which is incorporated by reference herein. The PCT International Patent Application was published in Chinese.

FIELD OF THE INVENTION

The present disclosure generally relates to the technical field of mobile terminals, and more particularly, to a mobile terminal and a volume adjusting method and device thereof.

BACKGROUND OF THE INVENTION

With continuous advancement of the mobile terminal technologies, users' requirements on functions of mobile terminals become increasingly higher.

Here, a mobile phone will be taken as an example. Conventionally, when a user is using a mobile phone to make or receive a call or to listen to a piece of MP3 music, the volume control value is usually determined by a volume scenario that is set in advance by the user. However, the user may change his or her position in the process of making or receiving the call or listening to the piece of music, and in this case, the environmental noises will vary at any time. For example:

when the user moves from an area where the noises are relatively loud into an area where the noises are relatively low, the volume that has been set high previously may sound harsh to the user' ears; or when the user moves from an area where the noises are relatively low into an area where the noises are relatively loud, the volume that has been set low may make it impossible for the user to hear the voices clearly from the mobile phone.

Conventionally, the user generally sets the volume level by means of a volume key or by entering into a volume menu, and this makes it very inconvenient for the user who is making or receiving a call or listening to a piece of MP3 music.

Accordingly, researches have to be made in the art to provide a technical solution that can adjust a volume control value of a mobile terminal in real time automatically according to the environmental noise levels so as to adjust the volume for convenience of the user.

SUMMARY OF THE INVENTION

An objective of the present disclosure is to provide a volume adjusting method for a mobile terminal, which can automatically adjust a volume control value of the mobile terminal in real time according to the noise level of the surroundings so as to adjust the volume.

To achieve the aforesaid objective, the present disclosure provides a volume adjusting method for a mobile terminal, which comprises the following steps of:

acquiring a noise pressure signal from surroundings of the mobile terminal;

comparing a volume value corresponding to the acquired noise pressure signal with a volume control value currently set in the mobile terminal;

adjusting the volume control value of the mobile terminal according to the comparison result; and controlling a volume level of the mobile terminal according to the volume control value that has been adjusted.

Preferably, the method further comprises the following step after the step of acquiring a noise pressure signal from surroundings of the mobile terminal:

converting the noise pressure signal acquired in an analog form into a noise pressure signal value of a digital form.

Preferably, the step of comparing a volume value corresponding to the acquired noise pressure signal with a volume control value currently set in the mobile terminal comprises:

acquiring the volume value corresponding to the noise pressure signal according to the noise pressure signal value and a volume value table stored in the mobile terminal.

Preferably, in the step of adjusting the volume control value of the mobile terminal according to the comparison result, the volume control value is increased or decreased in steps.

Another objective of embodiments of the present disclosure is to provide a volume adjusting device for a mobile terminal, which comprises:

a noise pressure signal acquiring module, being configured to acquire a noise pressure signal from surroundings of the mobile terminal;

a comparison module, being configured to compare a volume value corresponding to the acquired noise pressure signal with a volume control value currently set in the mobile terminal;

a volume control value adjusting module, being configured to adjust the volume control value of the mobile terminal according to the comparison result; and a volume control module, being configured to control a volume level of the mobile terminal according to the volume control value that has been adjusted.

Preferably, the device further comprises:

an analog-to-digital (A/D) converting module, being configured to convert the noise pressure signal acquired in an analog form into a noise pressure signal value of a digital form.

Preferably, the A/D converting module is further configured to:

acquire the volume value corresponding to the noise pressure signal according to the noise pressure signal value and a volume value table stored in the mobile terminal.

Preferably, the volume control value adjusting module is further configured to:

increase or decrease the volume control value in steps.

A further objective of the embodiments of the present disclosure is to provide a mobile terminal, which comprises a microphone configured to acquire a noise pressure signal and a sound player. The mobile terminal further comprises the volume adjusting device described in the previous embodiments of the present invention, and the volume adjusting device is connected to the microphone and the sound player respectively.

According to the embodiments of the present disclosure, a noise pressure signal is acquired from the surroundings, a volume value corresponding to the noise pressure signal is compared with a volume control value currently set in the mobile terminal, and then the volume control value of the mobile terminal is adjusted according to the comparison result. In this way, the mobile terminal can automatically adjust the volume control value of the mobile terminal in real time according to the noise level of the surroundings so as to adjust the volume. This is very convenient for the user and is favorable for popularization of mobile terminals.

BRIEF DESCRIPTION OF THE DRAWINGS

To describe the technical solutions of embodiments of the present disclosure more clearly, the attached drawings necessary for description of the embodiments will be introduced briefly hereinbelow. Obviously, these attached drawings only illustrate some of the embodiments of the present disclosure, and those of ordinary skill in the art can further obtain other attached drawings according to these attached drawings without making inventive efforts. In the attached drawings.

DETAILED DESCRIPTION OF THE INVENTION

To make the objectives, technical solutions and advantages of the present disclosure clearer, the present disclosure will be further described hereinbelow with reference to the attached drawings and embodiments thereof. It shall be understood that, the embodiments described herein are only intended to illustrate but not to limit the present disclosure.

Figure 1:
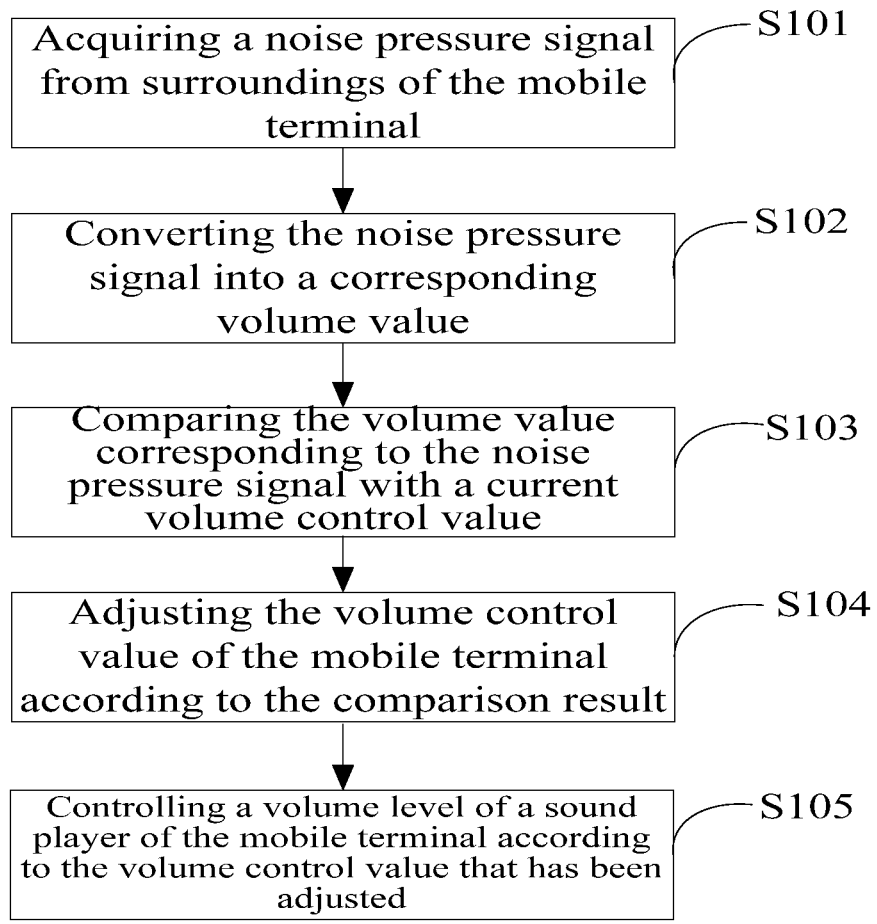
FIG. 1 is a flowchart diagram of a volume adjusting method for a mobile terminal according to an embodiment of the present disclosure.

FIG. 1 illustrates a process flow of a volume adjusting method for a mobile terminal according to an embodiment of the present disclosure.

Step S101: acquiring a noise pressure signal from surroundings of the mobile terminal.

In this embodiment of the present disclosure, the noise pressure signal of the surroundings is acquired by a microphone, and the microphone may be a mobile-phone microphone or an earphone microphone.

Step S102: converting the noise pressure signal into a corresponding volume value.

In this embodiment of the present disclosure, the noise pressure signal of an analog signal form is converted into a noise pressure signal value of a digital form by an analog-to-digital (A/D) converting module disposed in a baseband chip of the mobile terminal.

In practical implementations, the baseband chip of the mobile terminal acquires the volume value corresponding to the noise pressure signal according to the noise pressure signal value and a volume value table stored in the mobile terminal.

Step S103: comparing the volume value corresponding to the acquired noise pressure signal with a volume control value currently set in the mobile terminal.

Step S104: adjusting the volume control value of the mobile terminal according to the comparison result.

In practical implementations, in the step of adjusting the volume control value of the mobile terminal according to the comparison result, the volume control value is increased or decreased in steps.

Step S105: controlling a volume level of a sound player of the mobile terminal according to the volume control value that has been adjusted.

Preferably, the sound player is a receiver or an earphone microphone of the mobile terminal.

A mobile phone will be taken as an example. When a user is using the mobile phone to make or receive a call, the microphone is in a working status and acquires a noise pressure signal from surroundings continuously. A baseband chip of the mobile phone carries out ADC conversion once every 200 milliseconds on the noise pressure signal acquired by the microphone. For example, the microphone continuously acquires the noise pressure signal 5 times to obtain five noise pressure signal values; and then a maximum value and a minimum value are removed to calculate an average value of the left three values as a noise pressure signal value of the current surroundings. This can improve the accuracy.

According to the noise pressure signal value obtained through calculation, the baseband chip of the mobile phone acquires a volume value corresponding to the noise pressure signal by looking up a table, then compares the volume value corresponding to the noise pressure signal with a volume control value that is actually set currently, and adjusts the volume control value according to the comparison result.

In order to achieve a smooth transition of the volume, the volume control value is set by increasing or decreasing the volume control value in steps. If there is a need to increase or decrease the volume control value, then the volume control value is adjusted by only one step at each time until reaching the volume value corresponding to the noise pressure signal of the current surroundings. This can improve the comfortableness for the user's auditory sense.

In practical implementations, when the user uses a mobile terminal to listen to a piece of MP3 music, the baseband chip activates the microphone once every other second to acquire a noise pressure signal from the surroundings in order to reduce the power consumption of the mobile terminal.

Figure 2:
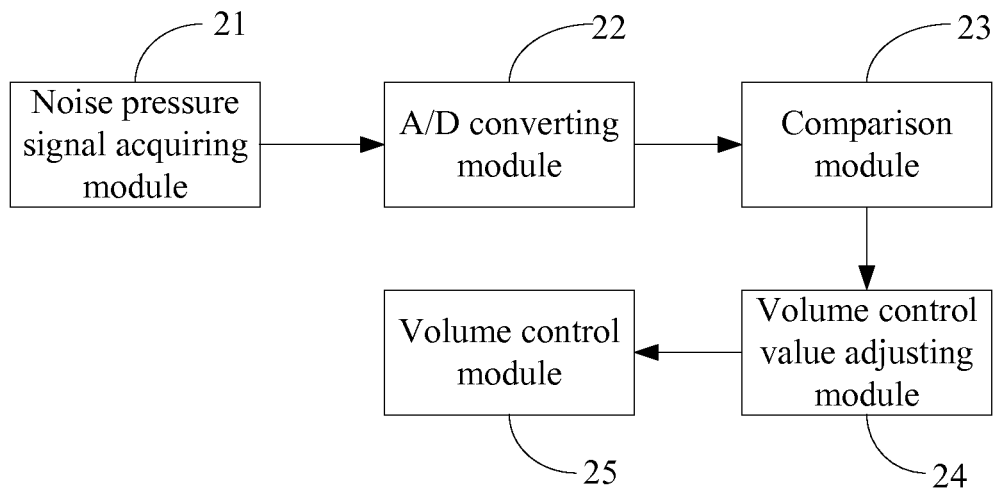
FIG. 2 is a view illustrating a structure of a volume adjusting device for a mobile terminal according to an embodiment of the present disclosure.

FIG. 2 illustrates a structure of a volume adjusting device for a mobile terminal according to an embodiment of the present disclosure. The volume adjusting device comprises a noise pressure signal acquiring module 21, an A/D converting module 22, a comparison module 23, a volume control value adjusting module 24 and a volume control module 25.

The noise pressure signal acquiring module 21 acquires a noise pressure signal from surroundings of the mobile terminal.

The A/D converting module 22 converts the noise pressure signal into a corresponding volume value.

In practical implementations, the A/D converting module 22 acquires a volume control value corresponding to the noise pressure signal according to the volume value corresponding to the noise pressure signal and a volume control value table stored in the mobile terminal.

The comparison module 23 compares the volume value corresponding to the acquired noise pressure signal with a volume control value currently set in the mobile terminal.

The volume control value adjusting module 24 adjusts the volume control value of the mobile terminal according to the comparison result of the comparison module 23.

In practical implementations, the volume control value adjusting module 24 increases or decreases the volume control value in steps.

The volume control module 25 controls a volume level of a sound player of the mobile terminal according to the volume control value that has been adjusted by the volume control value adjusting module 24.

Figure 3:
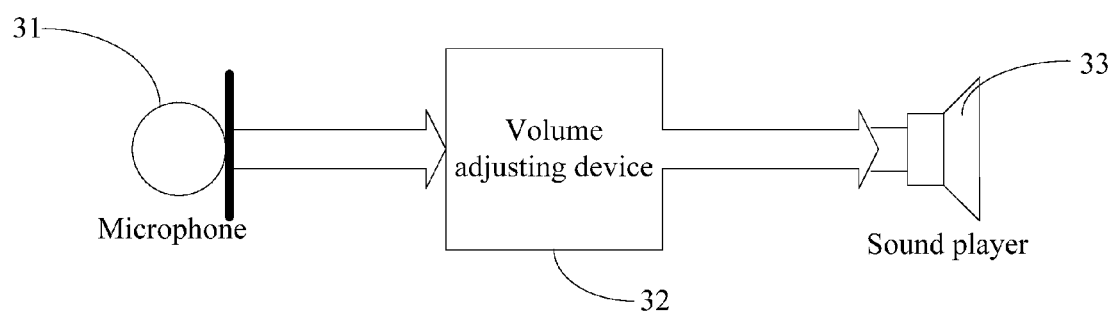
FIG. 3 is a view illustrating a structure of a mobile terminal according to an embodiment of the present disclosure.

FIG. 3 illustrates a structure of a mobile terminal according to an embodiment of the present disclosure.

The mobile terminal comprises a microphone 31 configured to acquire a noise pressure signal of the surroundings and a sound player 33 configured to play a sound. The mobile terminal further comprises the volume adjusting device 32 according to the previous embodiment of the present disclosure, and the volume adjusting device 32 is connected to the microphone 31 and the sound player 33 respectively. The process of the volume adjusting device 32 operating in combination with the microphone 31 and the sound player 33 has been detailed above, and thus will not be further described herein.

According to the embodiments of the present disclosure, a noise pressure signal is acquired from the surroundings, a volume value corresponding to the noise pressure signal is compared with a volume control value currently set in the mobile terminal, and then the volume control value of the mobile terminal is adjusted according to the comparison result. In this way, the mobile terminal can automatically adjust the volume control value of the mobile terminal in real time according to the noise level of the surroundings so as to adjust the volume. This is very convenient for the user and is favorable for popularization of mobile terminals.

It shall be understood that, those of ordinary skill in the art can make modifications or variations according to the above description, and all of the modifications and variations shall be covered within the scope of the attached claims of the present disclosure.

What is claimed is:

1. A volume adjusting method for a mobile terminal, comprising the following steps of:
   acquiring a noise pressure signal from surroundings of the mobile terminal, and converting the noise pressure signal acquired in an analog form into a noise pressure signal value of a digital form once every 200 milliseconds;
   comparing a volume value corresponding to the acquired noise pressure signal with a volume control value currently set in the mobile terminal;
   adjusting the volume control value of the mobile terminal according to the comparison result; and
   controlling a volume level of the mobile terminal according to the volume control value that has been adjusted;
   wherein
   an analog-to-digital conversion is carried out once every 200 milliseconds on the noise pressure signal;
   wherein the noise pressure signal is continuously acquired 5 times every 200 milliseconds to obtain five noise pressure signal values; and a maximum value and a minimum value are removed to calculate an average value of the left three values as a noise pressure signal value of the current surroundings.

2. The volume adjusting method for a mobile terminal of claim 1, wherein the step of comparing a volume value corresponding to the acquired noise pressure signal with a volume control value currently set in the mobile terminal comprises:
   acquiring the volume value corresponding to the noise pressure signal according to the noise pressure signal value and a volume value table stored in the mobile terminal.

3. The volume adjusting method for a mobile terminal of claim 1, wherein in the step of adjusting the volume control value of the mobile terminal according to the comparison result, the volume control value is increased or decreased in steps.

4. The volume adjusting method for a mobile terminal of claim 1, wherein the noise pressure signal is acquired once every other second when the mobile terminal is being used to listen to a piece of MP3 music in order to reduce the power consumption of the mobile terminal.

5. The volume adjusting method for a mobile terminal of claim 1, wherein the volume value corresponding to the acquired noise pressure signal is compared only once with the volume control value currently set in the mobile terminal before the volume control value of the mobile terminal is adjusted according to the comparison result.

6. A volume adjusting device for a mobile terminal, comprising:
   a noise pressure signal acquiring module, being configured to acquire a noise pressure signal from surroundings of the mobile terminal;
   an analog-to-digital (A/D) converting module, being configured to convert the noise pressure signal acquired in an analog form into a noise pressure signal value of a digital form once every 200 milliseconds;
   a comparison module, being configured to compare a volume value corresponding to the acquired noise pressure signal with a volume control value currently set in the mobile terminal;
   a volume control value adjusting module, being configured to adjust the volume control value of the mobile terminal according to the comparison result; and
   a volume control module, being configured to control a volume level of the mobile terminal according to the volume control value that has been adjusted;
   wherein the noise pressure signal is continuously acquired 5 times every 200 milliseconds to obtain five noise pressure signal values; and a maximum value and a minimum value are removed to calculate an average value of the left three values as a noise pressure signal value of the current surroundings.

7. The volume adjusting device for a mobile terminal of claim 6, wherein the A/D converting module is further configured to:
   acquire the volume value corresponding to the noise pressure signal according to the noise pressure signal value and a volume value table stored in the mobile terminal.

8. The volume adjusting device for a mobile terminal of claim 6, wherein the volume control value adjusting module is further configured to:
   increase or decrease the volume control value in steps.

9. The volume adjusting device for a mobile terminal of claim 6, wherein the noise pressure signal is acquired once every other second when the mobile terminal is being used to listen to a piece of MP3 music in order to reduce the power consumption of the mobile terminal.

10. A mobile terminal, comprising a microphone configured to acquire a noise pressure signal and a sound player, the mobile terminal further comprising a volume adjusting device, the volume adjusting device is connected to the microphone and the sound player respectively wherein the volume adjusting device comprising:
   a noise pressure signal acquiring module, being configured to acquire a noise pressure signal from surroundings of the mobile terminal;
   an analog-to-digital (A/D) converting module, being configured to convert the noise pressure signal acquired in an analog form into a noise pressure signal value of a digital form once every 200 milliseconds;
   a comparison module, being configured to compare a volume value corresponding to the acquired noise pressure signal with a volume control value currently set in the mobile terminal;
   a volume control value adjusting module, being configured to adjust the volume control value of the mobile terminal according to the comparison result; and
   a volume control module, being configured to control a volume level of the mobile terminal according to the volume control value that has been adjusted;
   wherein the noise pressure signal is continuously acquired 5 times every 200 milliseconds to obtain five noise pressure signal values; and a maximum value and a minimum value are removed to calculate an average value of the left three values as a noise pressure signal value of the current surroundings.

11. The mobile terminal of claim 10, wherein the A/D converting module is further configured to:
  acquire the volume value corresponding to the noise pressure signal according to the noise pressure signal value and a volume value table stored in the mobile terminal.

12. The mobile terminal of claim 10, wherein the volume control value adjusting module is further configured to:
  increase or decrease the volume control value in steps.

13. The mobile terminal of claim 10, wherein the noise pressure signal is acquired once every other second when the mobile terminal is being used to listen to a piece of MP3 music in order to reduce the power consumption of the mobile terminal.

14. The mobile terminal of claim 10, wherein the volume value corresponding to the acquired noise pressure signal is compared only once with the volume control value currently set in the mobile terminal before the volume control value of the mobile terminal is adjusted according to the comparison result.

* * * * *